(12) United States Patent  
Hashimoto

(10) Patent No.: US 7,747,343 B2  
(45) Date of Patent: Jun. 29, 2010

(54) SUBSTRATE PROCESSING APPARATUS AND SUBSTRATE HOUSING METHOD

(75) Inventor: Katsuyuki Hashimoto, Tokyo (JP)

(73) Assignee: Olympus Corporation, Tokyo (JP)

( * ) Notice: Subject to any disclaimer, the term of this patent is extended or adjusted under 35 U.S.C. 154(b) by 792 days.

(21) Appl. No.: 11/377,509

(22) Filed: Mar. 16, 2006

(65) Prior Publication Data

US 2006/0215152 A1    Sep. 28, 2006

(30) Foreign Application Priority Data

Mar. 22, 2005    (JP)    ............... P2005-081607

(51) Int. Cl.
    *G06G 7/00*    (2006.01)
(52) U.S. Cl. .................. 700/218; 700/228; 414/935
(58) Field of Classification Search .............. 414/800, 414/935; 438/14; 355/53; 356/401; 700/213, 700/218
    See application file for complete search history.

(56) References Cited

U.S. PATENT DOCUMENTS

| | | | |
|---|---|---|---|
| 5,822,213 A * | 10/1998 | Huynh | ...................... 700/213 |
| 5,917,601 A * | 6/1999 | Shimazaki et al. | ......... 356/622 |
| 5,980,194 A * | 11/1999 | Freerks et al. | ............... 414/754 |
| 6,327,517 B1 * | 12/2001 | Sundar | ....................... 700/245 |
| 2003/0231950 A1 * | 12/2003 | Raaijmakers | ............... 414/800 |
| 2005/0151947 A1 * | 7/2005 | Fujimaki | ..................... 355/55 |
| 2005/0219491 A1 * | 10/2005 | Hayashi | ....................... 355/55 |
| 2005/0287821 A1 * | 12/2005 | Higashi et al. | ............. 438/780 |

FOREIGN PATENT DOCUMENTS

| | | |
|---|---|---|
| JP | 07-263518 A | 10/1995 |
| JP | 09-102257 A | 4/1997 |
| WO | WO 02/21589 A1 | 3/2002 |

* cited by examiner

*Primary Examiner*—Gene Crawford
*Assistant Examiner*—Ramya Prakasam
(74) *Attorney, Agent, or Firm*—Frishauf, Holtz, Goodman & Chick, P.C.

(57) ABSTRACT

A substrate housing method for a substrate processing apparatus, including: a first step of transporting the substrate taken out from a housing case to the substrate processing apparatus by a transport means; a third step of processing the substrate at the substrate processing apparatus; a fourth step of returning the substrate after the third step to the housing case by the transport means; a second step of calculating a difference in amount in relation to a normal position of the substrate at the transport means from the first step and before the fourth step; and a fifth step of adjusting a returning position of the substrate in the housing case after the third step and until the fourth step.

2 Claims, 4 Drawing Sheets

SUBSTRATE PROCESSING APPARATUS AND SUBSTRATE HOUSING METHOD

BACKGROUND OF THE INVENTION

1. Field of the Invention

The present invention relates to a substrate processing apparatus such as a substrate inspection apparatus, a substrate production apparatus and the like and a substrate housing method.

Priority is claimed on Japanese Patent Application No. 2005-81607, filed Mar. 22, 2005, the content of which is incorporated herein by reference.

2. Description of the Related Art

Generally, upon inspecting outside of a semiconductor wafer (substrate), after picking up the semiconductor wafer set in a cassette by a transportation robot, pre-alignment is performed before transporting to a micro inspection portion. When performing the pre-alignment the semiconductor wafer is placed at a precise position by performing an alignment adjustment with higher precision than the pre-alignment at the micro inspection portion, and after that, micro inspection is performed. After finishing this micro inspection, the semiconductor wafer is set to the cassette by the transportation robot (see, for example, PCT International Publication No. WO 02/21589).

That is, if the center of the semiconductor wafer is shifted 1-2 mm upon transporting the semiconductor wafer from the cassette to the inspection apparatus, then there may be a case where it is impossible to perform the alignment in the micro inspection portion, therefore, the pre-alignment is performed in order to make it possible to perform alignment precisely at the micro alignment portion.

This semiconductor wafer is received by a rotation stage waiting at a predetermined position in the micro inspection portion, and the alignment adjustment with higher precision and the micro inspection are performed. After finishing the micro inspection, the rotation stage returns to the waiting position and the semiconductor wafer is set to the cassette by the transmission robot.

As described above, the alignment with high precision is performed before the micro inspection, however, after the micro inspection, the rotation stage mounting the semiconductor wafer returns to the waiting position automatically, therefore, the semiconductor wafer is received by the transmission robot in a state in which the center is shifted.

SUMMARY OF THE INVENTION

A first aspect of the present invention is a substrate housing method for a substrate processing apparatus, including: a first step of delivering the substrate taken out from a housing case to the substrate processing apparatus by a transport unit; a second step of processing the substrate at the substrate processing apparatus; a third step of taking the substrate after processing from the substrate processing apparatus by the transport unit; a fourth step of returning the substrate after processing to the housing case by the transport unit; a first process of calculating a difference in amount in relation to a normal position of the substrate at the transport unit while in time starting with the first step and before the fourth step; and a second process of adjusting a returning position of the substrate in the housing case based on the calculated difference in amount while in time after the first process and before the fourth step.

It should be noted that processing of the substrate at the substrate processing apparatus is, for example, production of the substrate or inspection of the substrate.

A second aspect of the present invention is a substrate processing apparatus including: a processing apparatus which processes a substrate taken out of a housing case; a transport unit which transports the substrate from the processing apparatus to the housing case that houses the substrate; a difference calculation portion which calculates a difference in the substrate in relation to a normal position of the substrate at the transport unit; and a difference adjustment unit which adjusts a returning position of the substrate in the housing case based on the difference in amount calculated by the difference calculation unit.

DETAILED DESCRIPTION OF THE INVENTION

Hereinafter, referring to figures, especially FIGS. 1 and 2, a first embodiment of the present application is explained.

Figure 1:
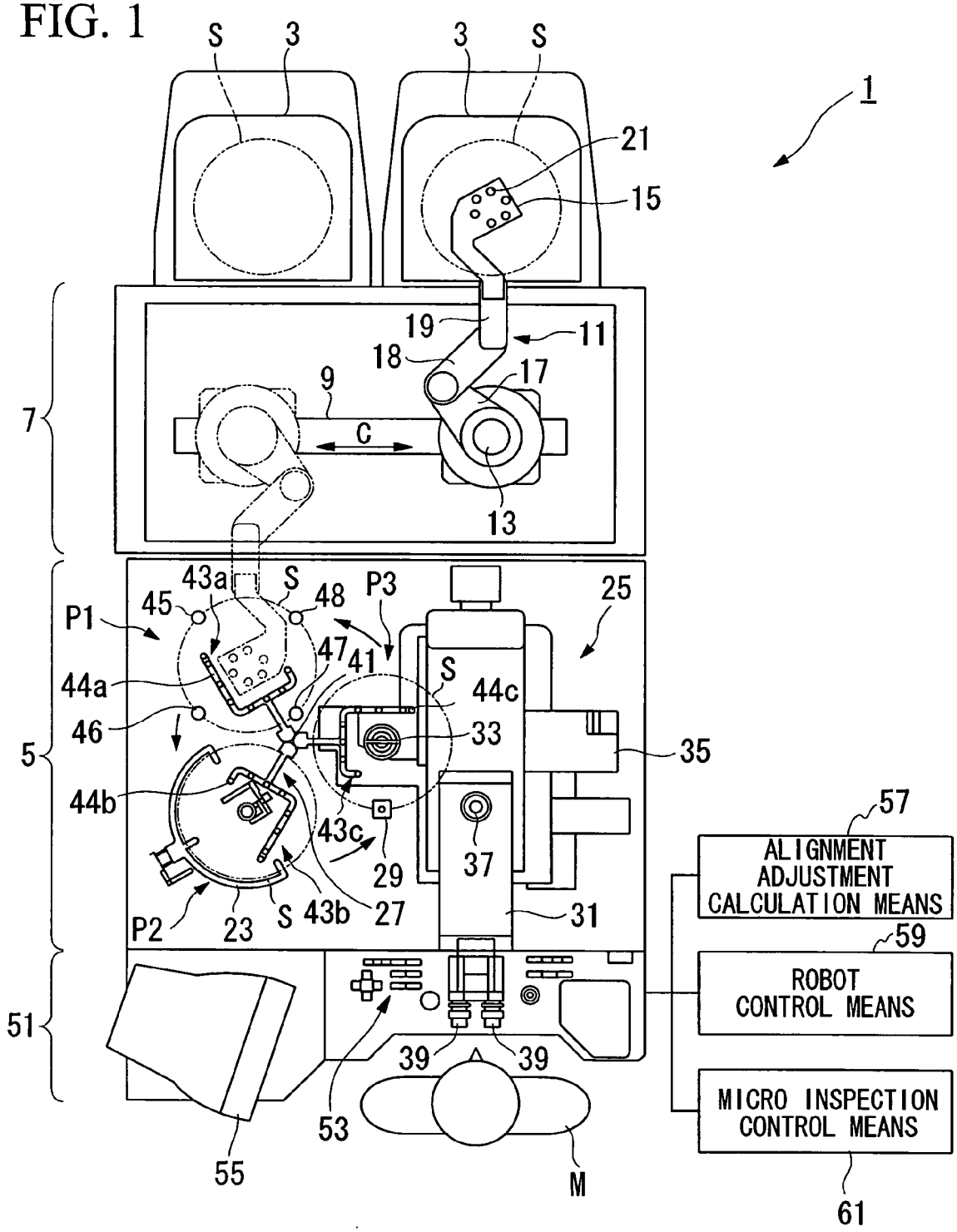
FIG. 1 is an outline plan view showing a substrate inspection apparatus according to an embodiment of the present invention.

As shown in FIG. 1, a substrate inspection apparatus (substrate processing apparatus) 1 corresponding to a substrate housing method of the present invention, performs a defect inspection process on front and back faces of a semiconductor wafer (substrate) S on which a device pattern is formed. A wafer cassette (housing case) 3 is assigned to this substrate inspection apparatus 1, and inside this wafer cassette 3, multiple semiconductor wafers S are housed with a predetermined vertical interval. The substrate inspection apparatus 1 has an inspection portion 5 which inspects the semiconductor wafers S, and a loader portion (a second transportation portion) 7 which transports the semiconductor wafers S between the wafer cassette 3 and the inspection portion 5.

The loader portion 7 is constructed by, for example, attaching multiple (2 in the example shown in the figure) wafer cassettes 3 detachably, and has a wafer transport robot 11 that moves back and forth among these wafer cassettes 3 by using a shift mechanism 9. The shift mechanism 9 moves back and forth in one direction (direction C) by means of the wafer transport robot 11 between a position for delivering and receiving the semiconductor wafers S to/from each of the wafer cassettes 3 and a position for delivering and receiving the semiconductor wafers S to/from the inspection portion 5.

The wafer transport robot 11 is a so-called articulated robot which has a mounting board 15 in a laminate shape for mounting a rotation axis 13 and the semiconductor wafers S, and three coupling arms 17-19 for coupling the rotation axis 13 and the mounting board 15 with each other.

That is to say, an edge of the first coupling arm 17 is linked to the rotation axis 13 with full rotatablility, and another edge of the first coupling arm 17 is linked to one edge of the second coupling arm 18 with full rotatability. Another edge of the second coupling arm 18 is linked to one edge of the third coupling arm 19 with full rotatability, and another edge of the third coupling arm 19 is fixed to the mounting board 15. Accordingly, by rotating these three coupling arms 17-19 appropriately, the distance from the rotation axis 13 to the mounting board 15 is changed, thereby performing a sliding operation of the wafer transport robot 11.

Multiple suction apertures 21 are provided on a surface of the mounting board 15, and these suction apertures 21 are connected to a suction pump (not shown in figures). That is, when the suction pump works in a state in which the semiconductor wafer S is mounted on the surface of the mounting board 15, the semiconductor wafer S attaches to the mounting board 15 due to sucking force of the suction pump.

The loader portion 7 is constructed as described above, therefore, the mounting board 15 can be moved freely between each of the wafer cassettes 3 and a wafer carrying-in position P1 inside the inspection portion 5. It must be noted that the wafer carrying-in position P1 means a position where the semiconductor wafers S are delivered or received among the wafer transport robot 11 and the inspection portion 5.

The inspection portion 5 has a well-known macro inspection portion 23, a micro inspection portion (the main body of apparatus) 25 and a rotating transportation portion (first transportation portion) 27 which transports the semiconductor wafer S among the wafer carrying-in position P1 of the inspection portion 5, the macro inspection portion 23 and the micro inspection portion 25.

The micro inspection portion 25 has a position detection sensor 29 for alignment setting at a wafer delivery position P3 from/to the rotating transportation portion 27, a microscope 31 for magnifying images of the semiconductor wafer S, a wafer holding portion 33 on which the semiconductor wafer S is mounted on and which has a rotating mechanism, and an XY stage 35 for moving the wafer holding portion 33 between the wafer delivery position P3 and a predetermined inspection position of the microscope 31.

The position detection sensor 29 is constructed from, for example, a CCD (Charge-coupled devices) camera, and after the semiconductor wafer S is delivered from the rotating transportation portion 27 to the wafer holding portion 33, at the wafer delivery position P3 from the rotating transportation portion 27, the wafer holding portion 33 is rotated and the position detection sensor 29 detects edge positions of the semiconductor wafer S based on images. Detection results are used for adjusting the difference (positional difference, positional gap or misalignment) between the right position to the center of the semiconductor wafer S on the wafer holding portion 33 and the difference in the angle.

The micro inspection portion 25 makes it possible to capture images of the semiconductor wafer S magnified by the microscope 31 using an image capturing device 37, or to observe them via an ocular lens 39.

The rotating transportation portion 27 rotates around a rotation axis 41 as a center (in the example of the figure, counterclockwise rotation), and has three rotation arms 43a-43c extending outward from the rotation axis 41 in orthogonal directions. These three rotation arms 43a-43c are set with the same interval angle (for example, 120 degrees) around the rotation axis 41. These three rotation arms 43a-43c circulate rotatively among the wafer carrying-in position P1 for carrying in from the wafer transport robot 11, a macro inspection position P2 for performing macro inspection by the macro inspection portion 23, and the wafer delivery position for delivering to the micro inspection portion 25.

Hands 44a-44c having an approximately L-shape for mounting the semiconductor wafers S are set to the rotation arms 43a-43c, respectively. Multiple suction apertures are formed on the surfaces of the hands 44a-44c, and are connected to a suction pump (not shown in figures). That is, when the suction pump works in a state in which the semiconductor wafer S is mounted on the surfaces of the hands 44a-44c, the semiconductor wafer S attaches to the hands 44a-44c due to the sucking force of the suction pump.

A transportation means for transporting the semiconductor wafers S is constructed with this rotating transportation portion 27, the shift mechanism 9 of the loader portion 7 and the wafer transport robot 11.

At the wafer carrying-in position P1, multiple (4 in the example of the figure) position detection sensors 45-48 are set for the pre-alignment process of the semiconductor wafers S. These position detection sensors 45-48 are constructed from, for example, two dimensional CCD cameras, and their centers are set on a concentric circle which is the same size as the semiconductor wafer S. The position detection sensors 45-48 are set respectively with an interval which is greater than an orientation plane of the semiconductor wafer S. These position detection sensors 45-48, upon delivering the semiconductor wafer S from the wafer transport robot 11 to the rotation arms 43a-43c, detect four points of edge positions (coordinate data) of the semiconductor wafer S.

The edge position information of the four points is used for detecting the difference in the center of the semiconductor wafer S from the normal position of the semiconductor wafer S at the wafer carrying-in position P1 of the rotation transportation portion 27 and for adjusting the difference in the center of the semiconductor wafer S.

Adjusting of the difference in the center at the wafer carrying-in position P1 requires precision such that the alignment at the micro inspection portion 25 is possible. Therefore, it is allowable for a pre-alignment device at the wafer carrying-in position P1 to adjust the difference in the center of the semiconductor wafer S, for example, by holding at least three points of edges of the semiconductor wafer S.

This inspection portion 5 has a control unit 51 that controls operation of the wafer transport robot 11 and the rotating transportation portion 27, and various operations of the macro inspection, micro inspection and the like at the inspection portion 5. This control unit 51 has a control portion 53 for operations of the loader portion 7 and various operations of the macro inspection, the micro inspection and the like of the inspection portion 5 controlled by an inspector M, a monitor 55 for showing magnified images of the semiconductor wafer S taken by the image capturing device 37 described above, an alignment adjustment calculation means 57, a robot control means 59, and a micro inspection portion control means 61.

The alignment adjustment calculation means 57 calculates the difference in the center and the angle of the semiconductor wafer S from the normal position appropriately based on detection results of the position detection sensors 45-48 set at the wafer carrying-in position P1 of the inspection portion 5 and the position sensor 29 set at the wafer delivery position P3 from/to the wafer holding portion 33.

This adjustment calculation means 57 has an amount calculation means that detects the amount of difference in the wafer holding portion 33 in the micro inspection portion 25 from the normal position, based on the edge position information of the semiconductor wafer S detected by the position detection sensor 29 of the micro detection portion 5. In this process, the semiconductor wafer S transported to the wafer delivery position P3 is delivered to the wafer holding portion 33 set at a waiting position, and at this waiting position, the wafer holding portion 33 rotates the semiconductor wafer S. Two or three points of the edge positions (coordinate data) of the semiconductor wafer S are detected by the position detection sensor 29 with high precision.

The robot control means 59 moves the wafer transport robot 11 mounting the semiconductor wafer S in the XY direction based on the calculated amount of difference by the alignment adjustment calculation means 57 based on the detection results of the position detection sensors 45-48, and sets the semiconductor wafer S at the normal position of the wafer carrying-in position P1.

The micro inspection portion control means 61, before starting the micro inspection, moves the wafer holding portion 33 using the XY stage 35 in accordance with the calculated amount of difference by the alignment adjustment calculation means 57 based on the detection results of the position detection sensor 29, and adjusts the positioning of the semiconductor wafer S with high accuracy to the microscope 31.

This micro inspection control means 61, after finishing the micro inspection, in accordance with the calculated amount by the alignment adjustment calculation means 57 based on the detection results of the position detection sensor 29, moves the wafer holding portion 33 in order to place the center of the wafer holding portion 33 at the normal position of the wafer delivery position P3, and sets the semiconductor wafer S at the normal position of the hands 44a-44c of the rotating transportation portion 27.

The micro inspection control means 61, after delivering the semiconductor wafer S to which the micro inspection has finished to the rotating transportation portion 27, moves the wafer holding portion 33 to the waiting position of the wafer delivering position P3.

A difference adjustment means which adjusts a returning position of the semiconductor wafer S into the wafer cassette 3, is constructed of the micro inspection control means 61 and the wafer holding portion 33 and the XY stage 35 of the micro inspection portion 25.

Next, the operation of the substrate inspection apparatus 1 constructed in the above described manner is explained.

First, the wafer cassette 3 housing the semiconductor wafer S which has not yet been inspected is attached to the loader portion 7. The wafer transport robot 11 detaches the semiconductor wafer S from the wafer cassette 3 and transports it to the wafer carrying-in position P1 where the semiconductor wafer S is delivered among the hands 44a-44c of the rotating transportation portion 27.

When the semiconductor wafer S is set at the wafer carrying-in position P1, the alignment adjustment calculation means 57 calculates the amount of difference between the center of the semiconductor wafer S and the hands 44a-44c based on the detected results of the edges of the semiconductor wafer S by the position detection sensor 45-48. Based on the amount of difference, the robot control means 59 moves the wafer transport robot 11 in the XY direction and roughly adjusts the difference in the center of the semiconductor wafer S from the hands 44a-44c.

After finishing this adjustment, the semiconductor wafer S is transported from the wafer transport robot 11 to the hands 44a-44c of the rotating transportation portion 27, and is transported from the wafer carrying-in position P1 to the macro inspection position P2 by rotation of the rotating transportation portion 27. The semiconductor wafer S is delivered from the hands 44a-44c to the macro inspection portion 23, and the macro inspection is processed on the semiconductor wafer S at the macro inspection portion 23. After finishing this macro inspection, the semiconductor wafer S is delivered from the macro inspection portion 23 to the hands 44a-44c, and is transported from the macro inspection position P2 to the wafer delivery position P3 for delivering to the micro inspection portion 25 by rotation of the rotating transportation portion 27.

Figure 2:
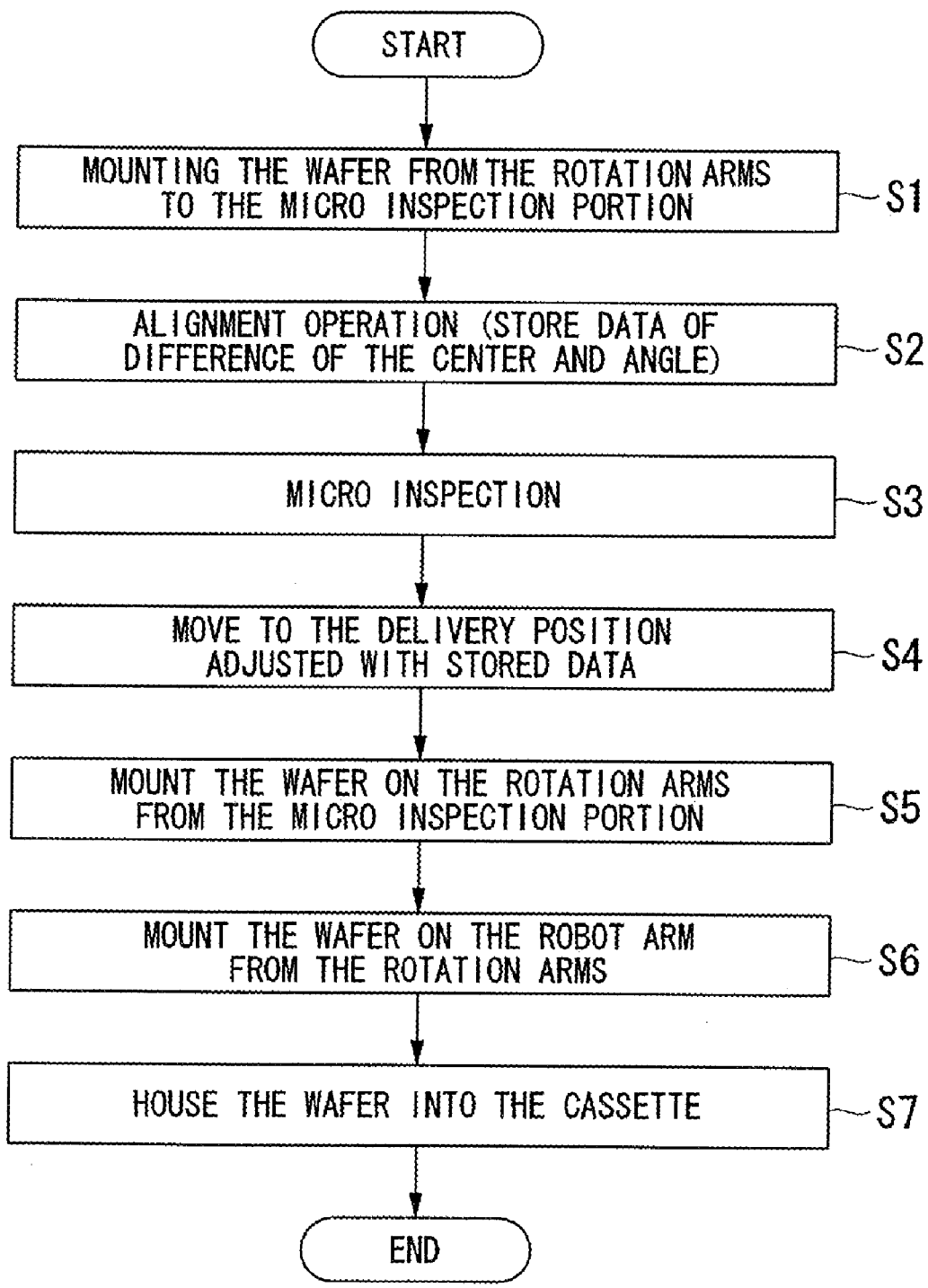
FIG. 2 is a flowchart explaining the operation of the substrate inspection apparatus shown in FIG. 1.

As shown in FIG. 2, the semiconductor wafer S is delivered from the hands 44a-44c of the rotation arms 43a-43c to the wafer holding portion 33 of the micro inspection portion 25 which is waiting at the center of the wafer delivery position P3 (step S1: first step). The wafer holding portion 33 is rotated and the position detection sensor 29 of the micro inspection portion 25 detects position of edges of the semiconductor wafer S. Based on the detection results of the edge positions of the semiconductor wafer S, the alignment adjustment calculation means 57 calculates and stores the amount of the difference of the center and the angle from the normal position of the hands 44a-44c to the semiconductor wafer S. After that, based on the amount of the difference, the micro inspection control means 61 moves the wafer holding portion 33 using the XY stage 35, the alignment process is operated in which the difference of the center and the angle of the semiconductor wafer S to the micro scope 31 is adjusted (step S2: first process). This step S2 includes a step for calculating the amount of the difference from the position of the semiconductor wafer S to the normal position of the semiconductor wafer S at the hands 44a-44c.

After that, the semiconductor wafer S is scanned by moving the XY stage 35 in directions along with the surface of the semiconductor wafer S, the semiconductor wafer S is magnified with the microscope 31 and the magnified image is shown on a monitor 55 or the micro inspection is operated by observing via the ocular lens 39 (step S3: second step).

After finishing the micro inspection, the micro inspection control means 61 controls the XY stage 35 and operates the wafer holding portion 33 mounting the semiconductor wafer S to move to the wafer delivery position P3 where the semiconductor wafer S is delivered from/to the hands 44a-44c. In this step, the wafer holding portion 33 is moved in a manner such that the center of the wafer holding portion 33 fits to the normal position of the wafer delivery position P3 (step S4: second process) based on the amount of difference stored by the micro inspection operation means 61 at the step S2. This step S4 shows a step of setting the semiconductor wafer S at the normal position of the hands 44a-44c based on the calculated amount of difference by the alignment adjustment calculation means 57.

The semiconductor wafer S is delivered from the wafer holding portion 33 of the micro inspection portion 25 to the rotation arms 43a-43c (first transport portion) (step S5), and is moved to the wafer carrying-in position P1 from the wafer delivery position P3 where it is delivered from/to the micro inspection portion 25 by rotation of the rotating transportation portion 27. The semiconductor wafer S is delivered from the hands 44a-44c to the mounting board 15 (second transport portion: robot arm) of the wafer transport robot 11 (step S6: third step). Finally, the mounting board 15 is delivered to the delivery position inside the wafer cassette 3 and the semiconductor wafer S is housed in the wafer cassette 3 (step S7: fourth step).

The operations above are performed on other semiconductor wafers S which have not been inspected yet and are housed in the wafer cassette 3.

As explained above, in accordance with the substrate inspection apparatus 1 and the substrate housing method, when the semiconductor wafer S is delivered from the micro inspection portion 25 to the rotating transportation portion 27, it is possible to set the semiconductor wafer S to which the micro inspection is per-formed to the normal position of the hands 44a-44c based on the calculated results of the difference (the amount of difference of the center and the angle) by the alignment adjustment calculation portion 57. In accordance with this, the semiconductor wafer S to which the micro inspection is performed and which is to be transported back to the wafer cassette 3, is delivered to the rotating transportation portion 27 in a condition of high accuracy positioning the same as that upon positioning of the semiconductor wafer S at the wafer delivery position P3 of the micro inspection portion 25. Therefore, the semiconductor wafer S is delivered to the wafer transport robot 11 in the same high accuracy positioning condition as at the micro inspection portion 25, and upon returning the semiconductor wafer S to the inside of the wafer cassette 3 by the wafer transport robot 11, it is possible to reliably prevent the semiconductor wafer S hitting walls of the wafer cassette 3 and it is possible to prevent damage occurring on the semiconductor wafer S and dust being deposited.

In the first embodiment, the semiconductor inspection apparatus 1 has the loader portion 7, however, this is not a limitation, for example, instead of the loader portion 7, it is possible to apply a structure such that the wafer cassette 3 is attached directly and detachably to a position close to the wafer carrying-in position P1 of the inspection portion 5. In this structure, instead of the rotating transportation portion 27, the wafer transport robot 11 is preferable to transport the semiconductor wafer S to the wafer carrying-in position P1, the macro inspection position P2 and the wafer delivery position P3. It is preferable to design the mounting board 15 of the wafer transport robot 11 to reach the wafer carrying-in position P1, the macro inspection position P2, the wafer delivery position P3 and the inside of the wafer cassette 3.

In the description above, the position detection sensor 29 of the micro inspection portion 25 is set at the wafer delivery position P3, however, this is not a limitation, that is to say, it can be set in a range of the wafer holding portion 33 moved by the XY stage 35.

Figure 3:
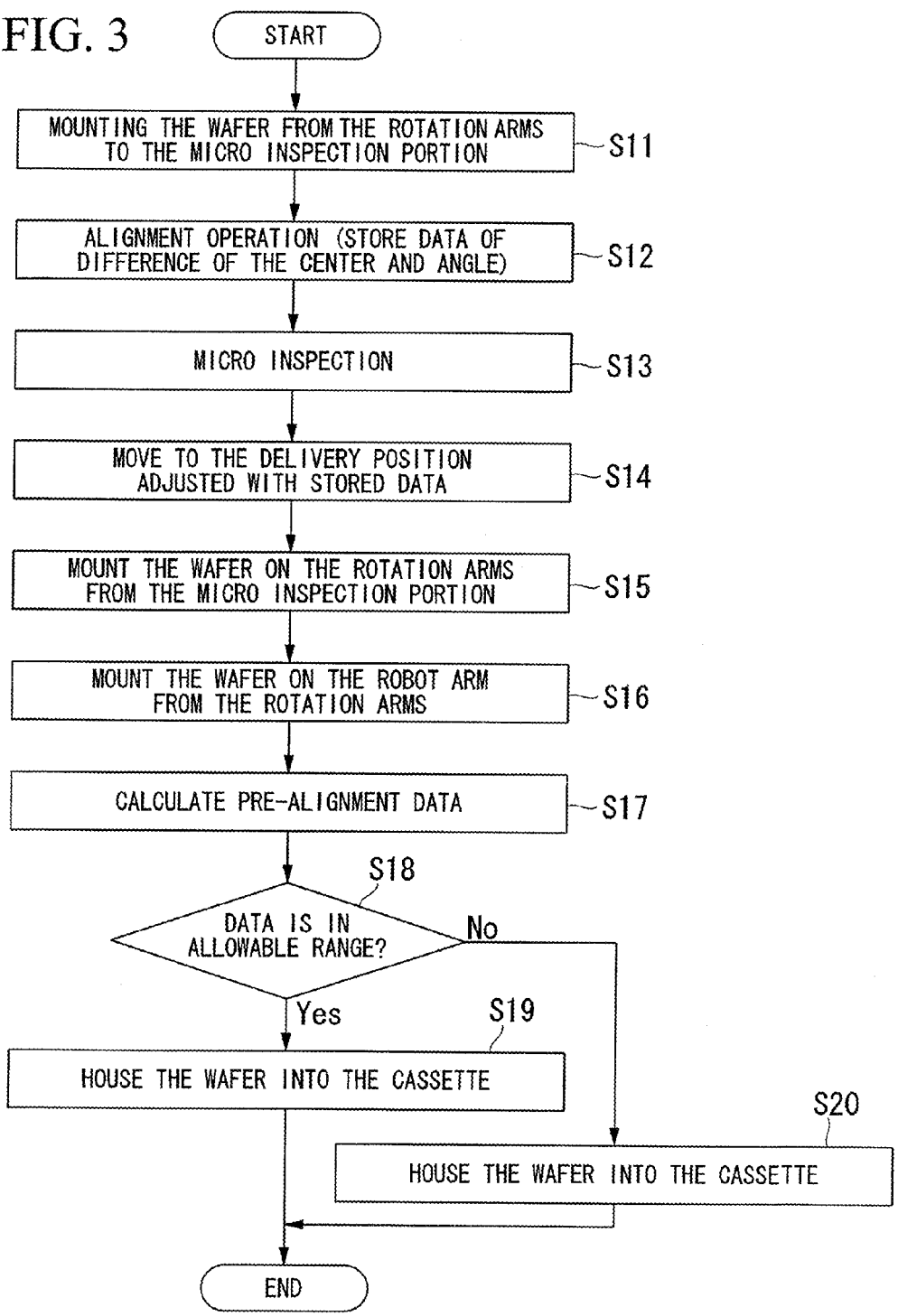
FIG. 3 is a flowchart explaining the operation of the substrate inspection apparatus according to another embodiment of the present invention.

Next, a second embodiment of the present invention is explained referring to FIG. 3. The structure of the substrate inspection apparatus 1 is the same as the first embodiment except for functions of the control unit 51 and steps of housing the semiconductor wafer S from the inspection portion 5 to the inside of the wafer cassette 3. Hereinafter, the functions of the control unit 51 and the steps of housing the semiconductor wafer S are explained and a description of same functions is omitted.

The alignment adjustment calculation means 57 has a function, in addition to the functions explained in the first embodiment, such as comparing the calculated amount of difference of the center based on the detection results of the positions of the edges of the semiconductor wafer S by the position detection sensor 45-48 set at the wafer carrying-in position P1 of the inspection portion 5, to a predetermined threshold, and outputting the comparison result.

The predetermined threshold indicates a threshold of the difference in amount of the semiconductor wafer S from the mounting board 15 of the wafer transport robot 11 or the hands 44a-44c of the rotating transportation portion 27. This threshold is stored in a memory portion (not shown in figures), and is a value for preventing the semiconductor wafer S contacting with walls inside the wafer cassette 3 when the mounting board 15 is in a state of being set at the delivery position inside the wafer cassette 3, even if the center of the semiconductor wafer S is set with a gap from the normal position of the mounting board 15 at the wafer carrying-in position P1.

A difference in amount detection means which calculates the size of the gap between the semiconductor wafer S and the normal position on the mounting board 15 of the wafer transport robot 11 is constructed from the alignment adjustment calculation means 57 and the position detection sensors 45-48 set at the wafer carrying-in position P1.

The robot control means 59 has a function, in addition to the functions of the first embodiment, such that, upon transporting the semiconductor wafer S from the wafer carrying-in position P1 to the wafer cassette 3, corresponding to the comparison result output from the alignment adjustment calculation means 57, based on the calculated amount of difference, it is determined whether or not the wafer transport robot 11 is moved. That is, if the detection result from the position detection sensors 45-48 (the difference in the center of the semiconductor wafer S) is larger than the threshold stored in the memory portion, then the robot control means 59 moves the wafer transport robot 11 in order to set the mounting board 15 at a position where the difference in the semiconductor wafer S is included in a range of the threshold in the delivery position of the wafer cassette 3.

The difference adjustment means which adjusts the returning position of the semiconductor wafer S inside the wafer cassette 3 is constructed from the robot control means 59 and the wafer transport robot 11.

Next, the operation of the substrate inspection apparatus 1 constructed in a manner described above, is explained.

First, the same as in the first embodiment, using the wafer transport robot 11, the semiconductor wafer S which has not been inspected yet is carried out of the wafer cassette 3 and transported to the inspection portion 5. Using the position detection sensors 45-48, the alignment adjustment calculation means 57, and the robot control means 59, the difference in the center of the semiconductor wafer S to the hands 44a-44c is adjusted roughly. After the macro inspection at the macro inspection portion 23, using the rotating transportation portion 27, the semiconductor wafer S is carried to the wafer delivery position P3 for delivering from/to the micro inspection portion 25.

After that, as shown in FIG. 3, the same as the steps S1-S6 of the first embodiment, delivering the semiconductor wafer S to the micro inspection portion 25 from the hands 44a-44c (step S1), the alignment process (step S12), the micro inspection (step S13), adjusting the delivery position for delivering from the micro inspection portion 25 to the hands 44a-44c (step S14), delivering from the micro inspection portion 25 to the hands 44a-44c (step S15), and delivering from the hands 44a-44c to the wafer transport robot 11 (step S16) are operated one by one.

After delivering from step S16, using the alignment adjustment calculation means 57, the difference in amount of the center of the semiconductor wafer S to the mounting board 15 of the hands 44a-44c and the wafer transport robot 11 is calculated. (step S17). In this step S17, by shifting the mounting board 15 slightly at the wafer carrying-in position P1, the difference in the center is detected.

After that, this difference in amount and the threshold stored in the memory portion beforehand are compared (step S18). In step S18, if it is found that the calculated difference in amount is lower than or equal to the threshold, then the mounting board 15 is moved to the delivery position inside the wafer cassette 3 and the semiconductor wafer S is housed inside the wafer cassette 3 (step S19).

In step S18, if it is found that the calculated difference in amount is larger than the threshold, then the robot control means 59 moves the wafer transport robot 11 in order to set the mounting board 15 at a position where the difference in amount of the semiconductor wafer S is included in a range of the threshold in the delivery position of the wafer cassette 3, and the semiconductor wafer S is housed inside the wafer cassette 3 (step S20). This step S20 shows a step of adjusting the position of the mounting board in relation to the wafer cassette 3 based on the calculated difference in amount by the alignment adjustment calculation means 57.

As described above, in accordance with the substrate inspection apparatus 1 and the substrate housing method for the same, when the semiconductor wafer S is delivered from the mounting board 15 of the wafer transport robot 11 to the wafer cassette 3, the position of the mounting board 15 is adjusted based on the difference in amount in relation to the wafer cassette 3. Therefore, based on the comparative physical relationship between the normal position of the semiconductor wafer S on the mounting board 15 and a regulated position of the semiconductor wafer S at the wafer cassette 3, it is possible to set the semiconductor wafer S at the regular position of the wafer cassette 3 more accurately.

Especially in a state such that the inspected semiconductor wafer S is set to the wafer transportation robot 11, the difference in amount of the center of the semiconductor wafer S is detected at the wafer carrying-in position P1, and if the difference in amount is larger than the predetermined threshold, then the returning position of the semiconductor wafer S to the wafer cassette 3 is adjusted. Therefore, even when it is not possible to adjust accurately due to an alignment problem at the wafer delivery position P3 caused by a difference that occurred while transporting from the wafer carrying-in position P1 to the wafer delivery position P3, or an abnormal stoppage because of a power failure and the like, upon returning the semiconductor wafer S to the wafer cassette 3, the difference in amount is calculated at the wafer carrying-in position P1 and the returning position of the semiconductor wafer S to the wafer cassette 3 is adjusted based on the difference in amount, therefore, it is possible to prevent damage occurring on the semiconductor wafer S and dust being deposited by the semiconductor wafer S hitting the walls of the wafer cassette 3.

In the above described second embodiment, the returning position of the semiconductor wafer S is adjusted when the mounting board 15 of the wafer transport robot 11 is set inside the wafer cassette 3, however, this is not a limitation and it is also preferable, for example, that adjustment is performed when the semiconductor wafer S is mounted on the wafer transport robot 11 from the rotating transportation portion 27.

In this case, at step S18, if the calculated difference in amount is larger than the threshold, then the semiconductor wafer S is delivered from the mounting board 15 of the wafer transport robot 11 to the hands 44*a*-44*c* of the rotating transportation portion 27 again. The mounting board 15 of the wafer transport robot 11 is moved based on the calculated difference in amount. After that, the semiconductor wafer S is delivered to the wafer transport robot 11 from the hands 44*a*-44*c*, therefore, the semiconductor wafer S is set at the normal position of the semiconductor wafer S at the wafer transport robot 11. Therefore, in this case, the same advantage as the second embodiment is obtained.

Moreover, the returning position of the semiconductor S is adjusted only when the calculated difference in amount is larger than the threshold, however, it is also preferable, for example, that the returning position of the semiconductor wafer S is adjusted independently of the threshold.

Figure 4:
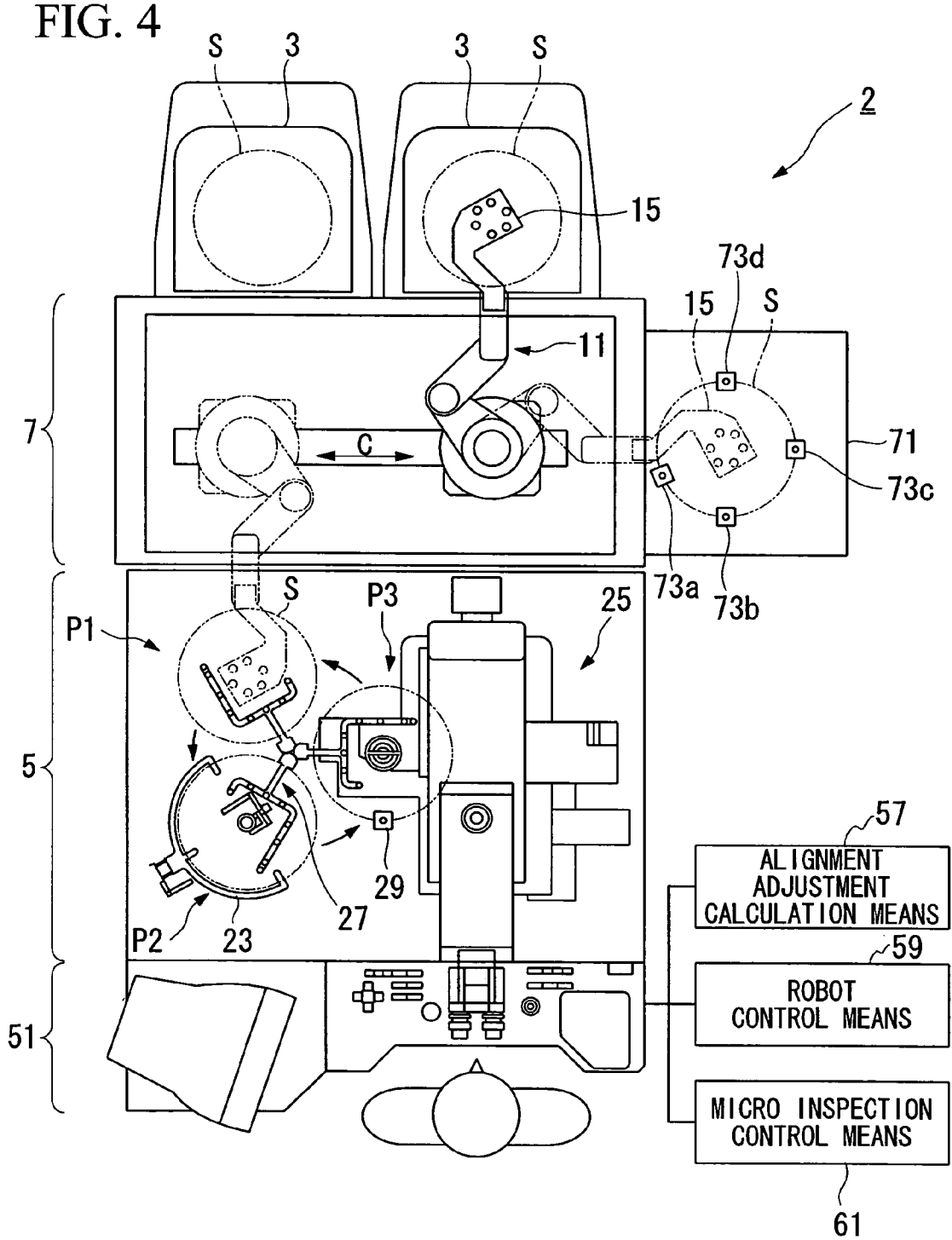
FIG. 4 is an outline plan view showing a substrate inspection apparatus according to another embodiment of the present invention.

In the first and second embodiments described above, the calculation and the adjustment of the difference in amount of the semiconductor wafer S in relation to the normal position of the wafer cassette 3 are operated at the substrate inspection apparatus 1, however, this is not a limitation and, for example, as shown in FIG. 4, it is preferable that they are operated at a substrate inspection apparatus 2 provided with an aligner 71 fixed adjacent to a transport portion 7. This aligner 71 detects the positions of the edges using position sensors 73*a*-73*d* before delivering the semiconductor wafer S which has been taken out of the wafer cassette 3, from the wafer transport robot 11 to the rotating transport portion 27.

In accordance with this structure, before mounting the semiconductor wafer S which has not been inspected yet on the rotating transport portion 27 from the wafer transport robot 11, the alignment adjustment calculation means 57 calculates the difference in amount of the semiconductor wafer S in relation to the wafer transport robot 11 and the normal position of the rotating transport portion 27 based on the detection results from the position detection sensors 73*a*-73*d* of the aligner 71. When the semiconductor wafer S is mounted on the rotating transport portion 27 from the wafer transport robot 11, the difference in the center is roughly adjusted based on the above described difference in amount while the wafer transport robot 11 is controlled by the robot control means 59.

In accordance with this structure, after mounting the semiconductor wafer S which is inspected on the wafer transport robot 11 from the rotating transport portion 27, the mounting board 15 of the wafer transport robot 11 is set inside an aligner 71. The edge position of the semiconductor wafer S is detected by the position detection sensors 73*a*-73*d* of the aligner 71. After that, based on the detection results, the alignment adjustment calculation means 57 calculates the difference in amount of the semiconductor wafer S in relation to the normal position of the mounting board 15. Finally, based on the difference in amount, the robot control means 59 moves the wafer transport robot 11 in order to set the mounting board 15 at a position shifted a certain amount from the delivery position, therefore, the semiconductor wafer S can be housed at a predetermined position inside the wafer cassette 3.

In accordance with this structure, the position detection sensors 45-48 at the wafer carrying-in position P1 are not necessary because they have the same function as the position detection sensor 73*a*-73*d* of the aligner 71.

If the aligner 71 has a wafer holding portion (not shown in figures) for delivering the semiconductor wafer S from/to the wafer transport robot 11, then it is not a limitation that the adjustment of the returning position of the semiconductor wafer S be operated when the mounting board 15 of the wafer transport robot 11 is set inside the wafer cassette 3, and it is also preferable that it is performed in a state such that the semiconductor wafer S is set at the aligner 71.

That is, after calculating the difference in amount of the semiconductor wafer S in relation to the mounting board 15 based on the detection results of the position detection sensors 73*a*-73*d*, the semiconductor wafer S is delivered from the mounting board 15 of the wafer transport robot 11 to the wafer holding portion of the aligner 71. The mounting board 15 of the wafer transport robot 11 is moved based on the difference in amount calculated by the robot control means 59. After that, the semiconductor wafer S is delivered from the wafer holding portion to the wafer transport robot 11, therefore, the semiconductor wafer S is set at the normal position of the wafer transport robot 11.

It is explained that the position detection sensors 45-48 used for calculating the difference in amount of the semiconductor wafer S in relation to the wafer transport robot 11 or the normal position of the rotating transport portion 27 are set at the wafer carrying-in position P1 or the aligner 71, however, this is not a limitation, for example, it is also preferable to set it halfway on a path between the wafer cassette 3 and the wafer carrying-in position P1. Moreover, at least one position detection sensor can be sufficient, and it can be halfway on the path.

It is described that the substrate inspection apparatus 1 performs the micro inspection of the semiconductor wafer S, however, this is not a limitation and it is also preferable to be applied to the micro inspection portion, the production apparatus or the like in the processing apparatus which is a substrate processing apparatus that performs, at least, appropriate processes on the semiconductor wafer S.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

In accordance with the substrate housing means of the substrate processing apparatus in the present invention, before returning the substrate to the housing case, the returning position of the substrate in the housing case is adjusted based on the difference in amount of the substrate, therefore, the substrate can be set at the regulated position of the housing case when the substrate is returned to the housing case. Therefore, it is possible to prevent the substrate hitting walls of the housing case and it is possible to prevent damage occurring on the substrate and dust being deposited.

Especially, in the steps of delivering the substrate from the processing apparatus to the transport means, when the substrate is set at the normal position of the transport means based on the calculated difference in amount, it is possible to set the substrate at the regulated position of the housing case accurately on the basis of the comparative physical relationship between the normal position of the transportation means and a regulated position of the housing case.

In accordance with the substrate processing apparatus of the present invention, even if the substrate has a difference in relation to the normal position of the transport means when it is transported from the processing apparatus to the housing case, the returning position of the substrate in the housing case is adjusted by the difference adjustment means based on the difference in amount calculated by the difference calculation means. Therefore, when the substrate is returned to the housing case, the substrate can be set at the regulated position for the substrate in the housing case.

What is claimed is:

1. A substrate housing method for a substrate processing apparatus comprising first and second transport units, the method comprising:
   delivering a substrate taken out from a housing case to the substrate processing apparatus by the second transport unit;
   processing the substrate at the substrate processing apparatus;
   taking the processed substrate from the substrate processing apparatus by the first transport unit and passing the processed substrate to the second transport unit; and
   returning the processed substrate to the housing case by the second transport unit;
   wherein after the processing of the substrate at the substrate processing apparatus and before the returning of the processed substrate by the second transport unit, a difference in amount between an actual position of the substrate and a normal position of the substrate at the second transport unit is calculated; and
   wherein upon delivering the processed substrate from the first transport unit to the second transport unit, a returning position of the substrate in the housing case is adjusted based on the calculated difference in amount.

2. The substrate housing method according to claim 1, wherein the calculation of the difference in amount between the actual position of the substrate and the normal position of the substrate at the second transport unit is performed after passing the processed substrate to the second transport unit.

* * * * *